United States Patent [19]
Ikeda

[11] Patent Number: 5,859,459
[45] Date of Patent: Jan. 12, 1999

[54] SEMICONDUCTOR MEMORY DEVICE AND METHOD OF MANUFACTURING THE SAME

[75] Inventor: Naoshi Ikeda, Kanagawa, Japan

[73] Assignee: Sony Corporation, Tokyo, Japan

[21] Appl. No.: 825,803

[22] Filed: Apr. 2, 1997

[30] Foreign Application Priority Data

Apr. 3, 1996 [JP] Japan ................................ 8-081388

[51] Int. Cl.$^6$ .......................... H01L 29/76; H01L 29/94; H01L 31/062; H01L 31/113
[52] U.S. Cl. .......................... 257/374; 257/315; 257/314
[58] Field of Search .................................. 257/315, 314, 257/317, 374

[56] References Cited

U.S. PATENT DOCUMENTS

| | | |
|---|---|---|
| 5,071,782 | 12/1991 | Mori . |
| 5,150,178 | 9/1992 | Mori . |
| 5,229,631 | 7/1993 | Woo . |
| 5,306,940 | 4/1994 | Yamazaki . |
| 5,432,112 | 7/1995 | Hong . |

*Primary Examiner*—Stephen Meier
*Attorney, Agent, or Firm*—Hill & Simpson

[57] ABSTRACT

A semiconductor device comprising: a substrate, a gate insulating layer formed on the substrate, insulating isolation layers formed on each side of the gate insulating layer, an impurity diffusion region formed in the substrate beneath the insulating isolation layer, a first conductive layer formed on both the gate insulating layer and the insulating isolation layer, and an element splitting trench which split up at least the insulating isolation layer and the impurity diffusion layer into two parts respectively and form a trench in the substrate and is buried with conductive material.

9 Claims, 12 Drawing Sheets

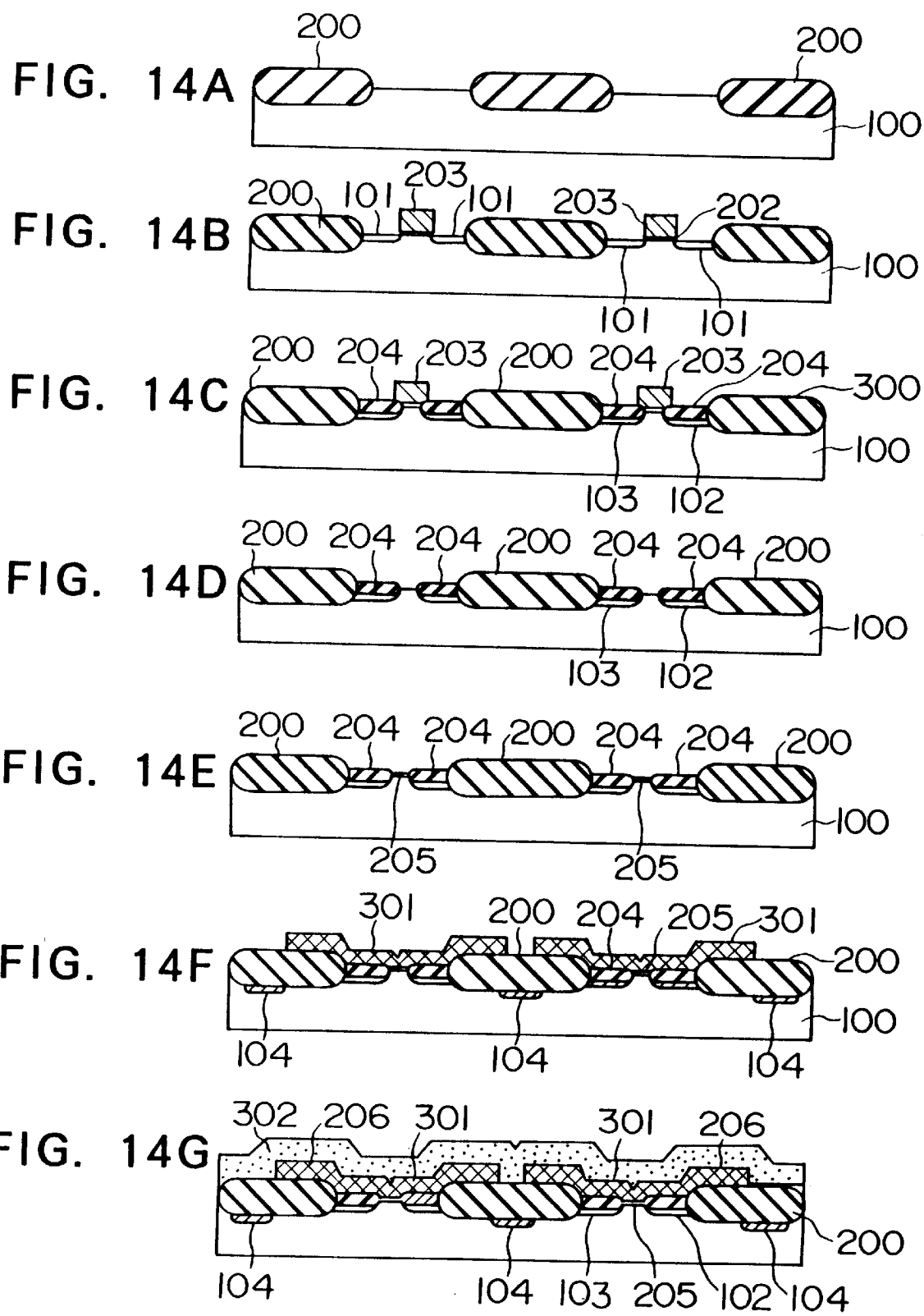

SEMICONDUCTOR MEMORY DEVICE AND METHOD OF MANUFACTURING THE SAME

BACKGROUND OF THE INVENTION

1. Field of the Invention

The present invention relates to a semiconductor memory device such as electrically erasable programmable ROM (EEPROM) and a method of manufacturing the same.

2. Description of the Related Art

In recent years, there has been much activity in development of electrically programmable-erasable non-volatile memory devices such as EPROMs or flash memory devices. A low cost and high density flash memory device is currently in great demand. Among flash memories, a flash memory in which both writing and erasing are performed by using the Fouler Nordheim (F-N) tunneling effect has various advantages compared with another type flash memory.

For example, this type of device can improve writing speed with inner booster circuit due to the small power consumption than channel hot electron (CHE) injection type devices.

It is well known that as to endurance of writing cycles the F-N tunneling over the entire area of the channel region has advantage in both writing and erasing.

In a device which write data by extracting electrons from a control gate using the F-N tunneling, it suffers from the disadvantage of low writing speed with the inner circuit due to tunnel current when writing data.

However, a flash memory described above requires a high voltage of about 20V when writing, so that it suffers from the disadvantage that it is hard to ensure withstand voltage for inversion and for punch-through in the isolation area between memory cells next to each other along a bit line.

In the case of isolation of a LOCOS and the like, if the thickness of the LOCOS would be thicker to ensure higher withstand voltage for inversion, isolation width would be wider because the LOCOS is thicker, the birds-beak is wider, so that the integration of large numbers of devices in a small area is more difficult.

It is possible to use trench isolation instead of LOCOS. But, to form trench isolation having both wide widths and narrow widths, it requires complex burying and planalization processes such as chemical mechanical planarization (CMP), so there is a problem of increased manufacturing costs.

Further, it is possible to form a more heavily doped channel stop. But, to ensure proper junction voltage, an isolation area between the source-drain region and the channel stop ion implantation region is required, so it would degrade the ability to have higher density.

SUMMARY OF THE INVENTION

An object of the present invention is to provide a semiconductor memory device which has short width of its element isolation as well as ensuring withstand voltage for inversion and for punch-through.

Another object of the present invention is to provide a method of manufacturing a semiconductor memory device which can be performed easily and accurately while avoiding complex processes.

According to one aspect of the present invention, there is provided a semiconductor memory device comprising: a substrate, a gate insulating layer formed on the substrate, insulating isolation layers on each side of the gate insulating layer, an impurity diffusion region formed in the substrate beneath the insulating isolation layer, a first conductive layer formed on both the gate insulating layer and the insulating isolation layer, and an element splitting trench which splits up at least the insulating isolation layer and the impurity diffusion layer into two parts respectively.

According to another aspect of the present invention, there is provided a method of manufacturing a semiconductor device comprising the steps of forming a stripe of plural impurity diffusion lines elongated in parallel each other, forming insulating isolation layers on an area of the impurity lines, forming a gate insulating layer in an area between the insulating isolation layers, forming a mask layer covering the gate insulating layer and the insulating isolation layer, forming an anti-etching layer on the mask layer, patterning the anti-etching layer, forming an element splitting trench which splits the impurity diffusion lines to form the source line and the drain line by etching the mask layer, the insulating isolation layer and the substrate successively using the patterned anti-etching layer as a mask, and burying the element splitting trench with insulating material.

The mask layer is formed for the purpose of protecting the gate insulating layer and the insulating isolation layer when etching an insulating layer formed on and inside the element splitting trench. The mask layer is composed of material having another etching rate different from the insulating layer for example second conductive layer such as polysilicone.

A semiconductor device of the present invention has a configuration that a first conductive layer exists on a substrate via a gate insulating layer, a diffusion region is formed beneath isolation layers existing on both side of the gate insulating layer, and each device is isolated with inslating splitting trench buried with insulating material (trench isolation) which is dug in a substrate separating and passing through the first conductive layer, the isolation insulating layer and the diffusion layer.

Therefore, since element isolation is provided by trench isolation which has high withstand voltage for inversion and for punch-through, and has short isolation width, a semiconductor device which has improved integration degree while ensuring withstand voltage for inversion and for punch-through can be provided. In addition, since trench isolation can be provided in only a memory cell area which needs short isolation width, whereas LOCOS can be provided in a peripheral circuit which needs wide isolation width, a difficult process which plugs wide trench can be avoided and increasing of cost is prevented.

In a manufacturing process of semiconductor device of the present invention, in an early stage a source-drain region of devices next to each other which requires element isolation is formed beneath an insulating isolation layer as common wide diffusion region. A first conductive layer covering a gate insulating layer and a insulating isolation layer is patterned and separated. At the same time, using the anti-etching layer at this step of process, etching is done through a insulating isolation layer and even a part of substrate in a same pattern, whereby a trench is formed on a substrate. This trench separates the wide common diffusion region to form a source line and a drain line.

Therefore, since self-aligned trench isolation which has high withstand for inversion and for punch-through, and provides short isolation width can be formed at the same time as a first conductive layer is patterned. Thus a device isolation can be produced surely through a very simple process without increasing size of memory cell. In addition, trench isolation can be provided in only a memory cell area which needs short isolation width, whereas LOCOS can be provided in a peripheral circuit which needs wide isolation width, so a difficult process which plugs wide trench can be avoided and increasing of cost is prevented.

BRIEF DESCRIPTION OF THE DRAWINGS

These and other objects and features of the present invention will become clear from the following description of the present invention made with reference to the accompanying drawings, in which:

FIG. 13 is a sectional view of MNOS type non-volatile memory which the present invention is applied to;

FIG. 14A to FIG. 14G are views of manufacturing process of conventional flash memory in a sectional view;

DESCRIPTION OF THE PREFERRED EMBODIMENTS

Before describing the preferred embodiments of the present invention, the related art will be described for background with reference to the drawings.

Figure 16:
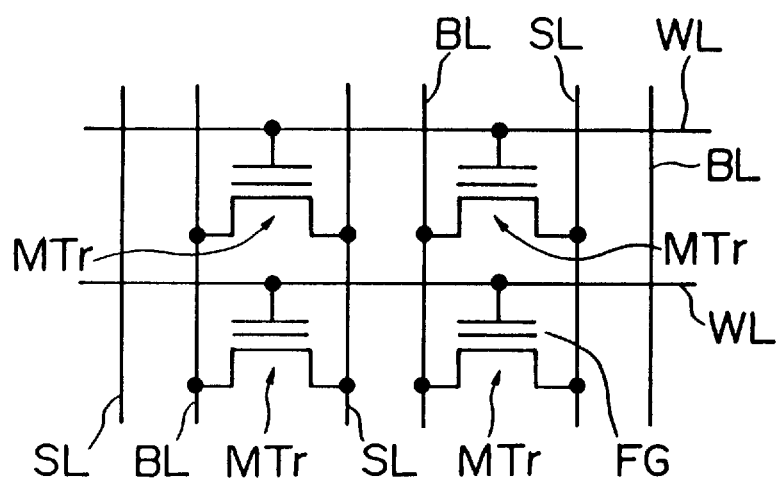
FIG. 16 is a schematic circuit diagram of flash memory shown in FIG. 12 and FIG. 13.

Among flash memories, flash EEPROMs having a memory array as shown in FIG. 16 are well known. In this flash memory, memory transistors MTr are arranged in matrix formation. Bit lines BL and source lines SL are wired in the perpendicular direction of the figure, and a memory transistor MTr of a memory array shown in the figure shares the bit line BL and the source line SL. Word lines (control gate) WL cross the bit lines BL at a right angle, and compose control gates of the memory transistors MTr. The memory transistors MTr along the word line WL are isolated each other.

Writing and erasing modes of this type of memory are as follows. The writing can be done by injecting electrons to floating gates FG, using Fouler Nordheim (F-N) tunneling over entire area of the channel region by applying positive bias voltage to the control gate CG. The erasing can be done by extracting electrons from the floating gates FG by applying negative bias voltage. This system has various advantages compared with another system.

For example, this system can accelerate the writing speed by an inner booster circuit due to small power consumption than a channel hot electron (CHE) injecting system.

It is well known that as to endurance of writing cycles the F-N tunneling over the entire area of channel region has an advantage in both writing and erasing.

In a device which writes data by extracting electrons from the control gates using the F-N tunneling, it suffers from the disadvantage of a low writing speed by an inner circuit due to the tunnel current when writing data.

The above memory device has an advantage in that the random access speed is more rapid than that of a NAND type memory device using the F-N tunneling over entire channel region as well as this memory device.

Next, an embodiment of a method of manufacturing a semiconductor memory-device having the above characteristics will be briefly explained referring to figures.

At first, as shown in FIG. 14A, a field oxide layer 200 is formed on a semiconductor substrate 100 using a LOCOS method.

Figure 15A:
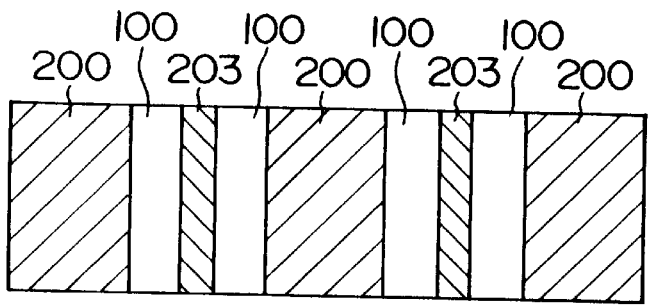
FIG. 15A to FIG. 15E are views of manufacturing process of conventional flash memory in a plan view.

Next, as shown in FIG. 14B and FIG. 15A, a pad oxide layer 202 and a silicon nitride layer 203 are formed and patterned to cover an area in which channel region is to be formed using a photolithography. In this case, a polysilicone layer would be formed between the pad oxide layer 202 and the silicon nitride layer 203 in order to release a stress of the silicon nitride layer 203. Next, boron or arsenic is implanted to the substrate 100 to form an impurity diffusion region 101 using the silicon nitride layer 203 as a mask.

Figure 15B:
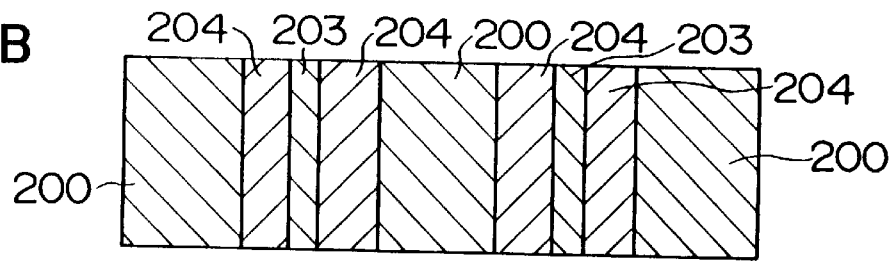

Next, as shown in FIG. 14C and FIG. 15B, thermal oxidation causes relatively thick oxide layer 204 since the silicon nitride layer 203 functions as an oxidizing mask. This oxidation causes drain line (bit line) 102 and a source line 103 to be beneath the oxide layer 204.

Figure 15C:
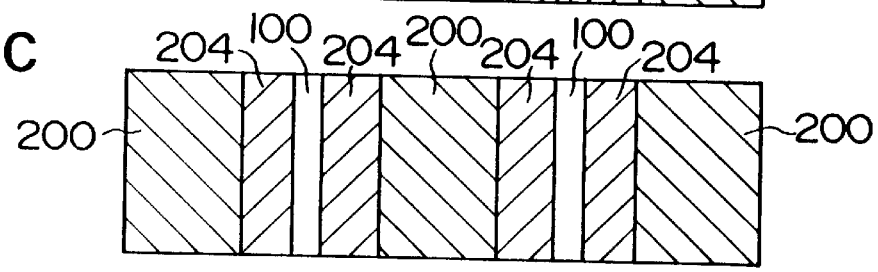

Next, as shown in FIG. 14D and FIG. 15C, the silicon nitride layer and the pad oxide layer are removed to expose a channel region.

Next, as shown in FIG. 14E, thermal oxidation produces a tunnel oxide layer 205.

Next, as shown in FIG. 14F, the polysilicone layer is formed and pattered to form a control gate.

Figure 15D:
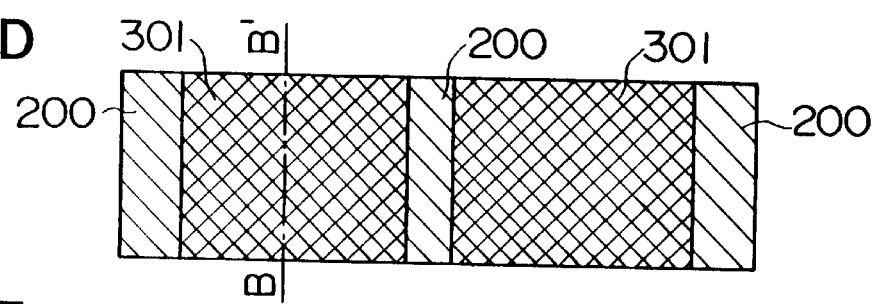

In this case, as shown in FIG. 15D, a part of the polysilicone layer 301 along bit line (in FIG. 15, direction of B–B') is not removed. Next, the impurity implantation is conducted to form a channel stop region. In order to ensure withstand voltage for inversion, the implantation would be of a high concentration at a dosage on the order of $10^{17}/cm^3$. A channel stop region should be formed in leaving spaces from a bit line 103 and a source line 102 to ensure withstand voltage for junction. This implantation can be done using a resist as a mask which is used in forming the control gate

301. But in order to prevent diffusion due to heat for forming an ONO layer composed of three layers of silicon oxide layer, silicon nitride layer and silicon oxide layer on the control gate 301, after forming the ONO layer, an ion implantation can be done through a lithography process.

Figure 15E:
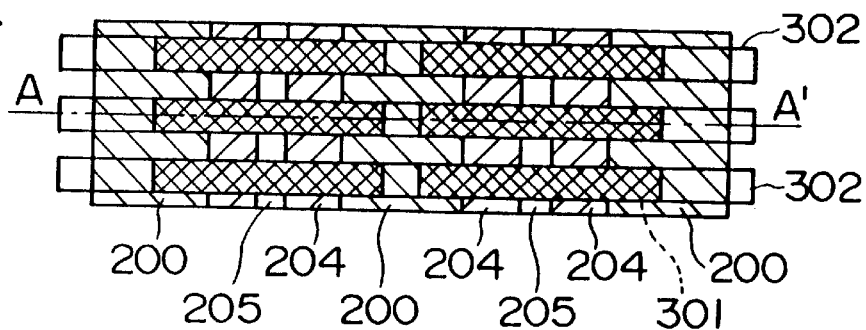

Next, after forming the ONO layer, the poliysilicone layer 302 which will form the control gate is deposited, and the resist layer is formed and patterned, and the control gate 302, the ONO layer 206 and the floating gate 301 are formed by single etching process. Further, using the resist layer as a mask used for patterning the control gate, boron is implanted to isolate memory cells next to each other along the bit line (B–B' line). Thus the memory cell configuration shown in FIG. 14G and FIG. 15E are created.

However, the memory device described above requires a high voltage of about 20V when writing, so it suffers from the disadvantage that it is difficult to ensure that to the withstand voltage for inversion there is sufficient isolation of memory cells next to each other along the bit line and to ensure the withstand voltage for punch-through.

In case of isolation of the LOCOS and the like, if the thickness of the LOCOS would be thicker to ensure the withstand voltage for inversion, the isolation width would be more wide because the LOCOS is thick, a birds-beak is wide, so high density integration is not possible.

It is possible to use a trench isolation instead of the LOCOS. But, to form a trench in an area of both wide width isolation and narrow width isolation, it requires complex burying and plannalization processes such as chemical mechanical planarization (CMP), thus causing a disadvantage of raising the manufacturing cost.

Further, it is possible to form a more heavily doped channel stop region. But, to ensure the Junction voltage, an isolation area between the source-drain region and the channel stop ion implant region is required, so it would also degrade the ability to provide high density integration degree.

Next, a preferred embodiment of semiconductor device and a method of manufacturing the same according to the present invention will be described.

Figure 1A:
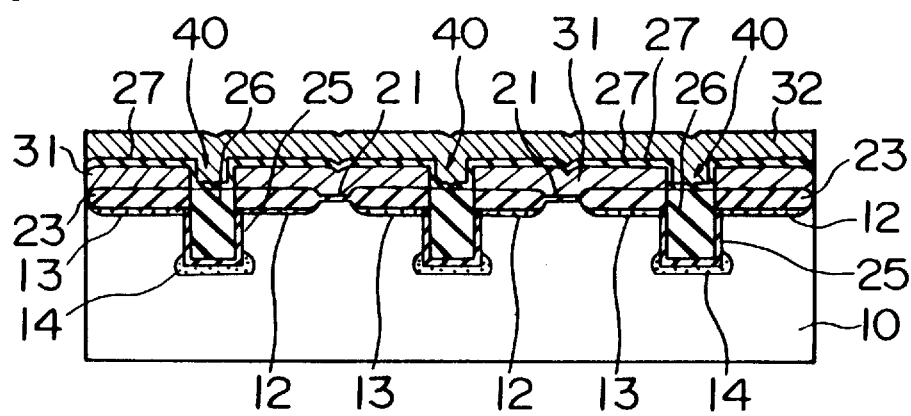
FIGS. 1A and 1B are views of an example of flash memory to which the present invention is applied, FIG. 1A being a sectional view, and FIG. 1B being a plan view.
Figure 1B:
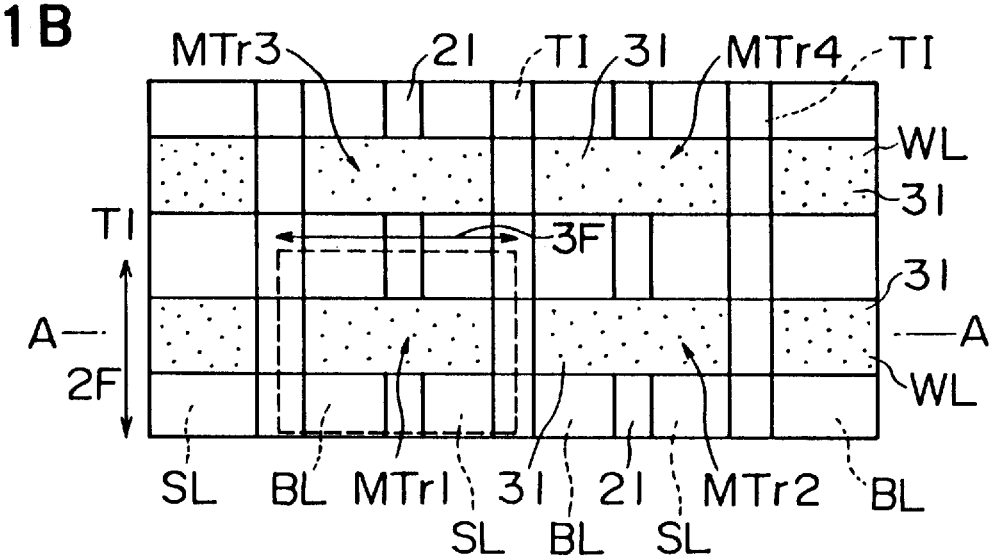
Figure 2:
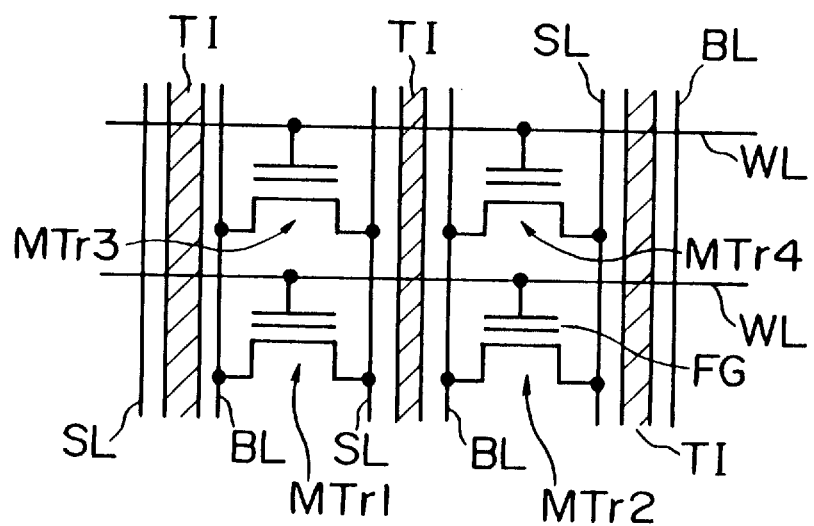
FIG. 2 is a schematic circuit diagram of semiconductor device shown in FIG. 1.

FIGS. 1A and 1B are views of an embodiment of the semiconductor device according to the present invention. The present invention is applied to a separated source type semiconductor device. FIG. 1A is a sectional view taken along the line A—A of FIG. 1B and FIG. 1B is a plan view. A circuit diagram of the semiconductor device is shown in FIG. 2.

A sectional configuration of the semiconductor device will be explained. A gate insulating layer 21 of thickness of approximately 10 nm and an insulating isolation layer 23 of thickness of 30 to 100 nm on both side of the gate insulating layer 21 are formed on a surface of a substrate 10. Impurity diffusion regions (source, drain) 12 and 13 are formed in the substrate 10 beneath the insulating isolation layer 23. A first conductive layer 31, which composes a floating gate, is formed on both the gate insulating layer 21 and the insulating isolation layer 23. An element splitting trench 40 is formed in an area of the substrate where a first conductive layer 31, an insulating isolation layer 23 and impurity diffusion regions 12 and 13 are separated from each other. This eliminates a splitting trench 40 has an oxide layer on an inner wall and is buried with an insulating material 26. A height of the insulating material 26 is approximately same to depth of the element splitting trench. A channel stop region 14 is formed in the substrate beneath bottom of the element splitting trench 40, whereby a better elimination isolation can be performed. An ONO layer 27 covers the first conductive layer 31, so the first conductive layer can be isolated from neighbor. A second conductive layer 32, which composes a control gate, is formed on the ONO layer 27.

A plan configuration of the semiconductor device will be explained referring to FIG. B. A second conductive layer 32, which composes a word line WL, runs horizontally in the figure. A bit line BL (drain 12) and a source line SL (source 13) run parallel each other, crossing the word line WL at a right angle. Memory transistors MTr1 to MTr4 are formed in an area where a word line WL and the gate insulating layer 21 cross each other. A floating gate 31 is formed in the area of the memory transistor beneath the lord line WL. A trench isolation TI (an element splitting trench 40) splits up a source line SL and a bit line BL each other, to split up memory transistors next to each other running parallel to the word line WL. The memory transistors running vertically in the figure share the bit line BL and the source line SL.

A circuit diagram of the semiconductor device shown in FIG. 2 will be explained. A pair of source line SL and bit line BL run parallel to each other. Many memory transistors (MTr2 and MTr4, and MTr1 and MTr3) shared a pair of source line SL and bit line BL are arrayed. A word line WL crosses the bit line BL at a right angle and comprises a control gate for each memory transistor. The memory transistor array not shared the source line SL and the bit line BL (running at right angle) is split up by the element splitting trench TI which splits the bit line BL and the source line SL.

In a write erase mode of this memory, electrons are injected to a floating gate 31 to write data using the F-N tunneling in entire channel region by a positive bias of 20V applied to the word line WL. For erasing, electrons are extracted from the floating gate 31, FG by a negative bias applied to the control gate 32, WL.

In a semiconductor device as explained above, a deep element splitting trench 40, TI splits up the memory transistors MTr1 and MTr2 each other and the memory transistors MTr3 and MTr4 each other which are next to each other parallel with the word line WL, so this semiconductor device has much higher withstand voltage for inversion and for punch-through compared with the LOCOS method. Therefore, when writing, applying a high bias voltage cause no problem. The trench isolation has no birds-beak compared with the LOCOS, so the isolation area can be reduced and the integration degree can be increased.

Next, an embodiment of manufacturing method of the semiconductor device as explained above will be explained referring to FIG. 3 to FIG. 9.

Figure 3A:
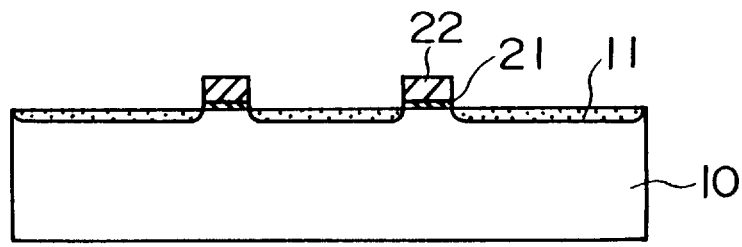
FIGS. 3A and 3B are views of a example of manufacturing process of semiconductor device of the present invention, FIG. 3A being a sectional view and FIG. 3B being a plan view.
Figure 3B:
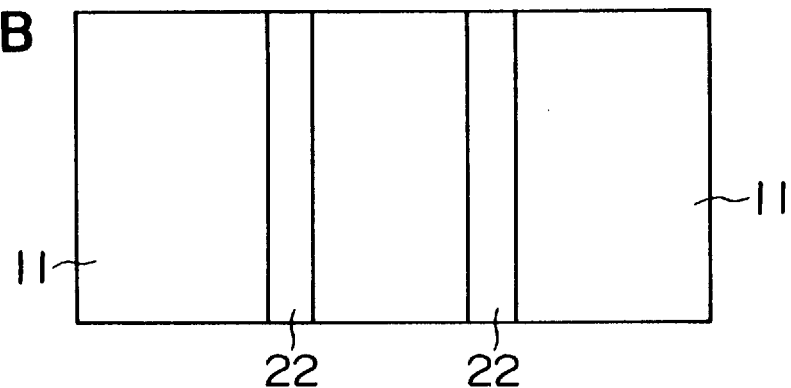

At first, as shown in FIGS. 3A and 3B, the pad oxide layer 21, prior to the formation of the silicon nitride layer 22 is formed on the substrate 10, and then they are patterned by photolithography and dry etching technology. In this case, a polysilicone layer would be formed between the pad oxide layer 21 and the silicon nitride layer 22 to reduce a stress of the silicon nitride layer 22. Before this process step, a LOCOS is formed in an area of a peripheral circuit other than the memory cell area. Next, an impurity diffusion line 11 is formed by phosphorus or arsenic ion implantation using the silicon nitride layer 22 as a mask. This impurity diffusion line 11 will be split up later by the element splitting trench to provide the source and drain of the transistor.

Figure 4A:
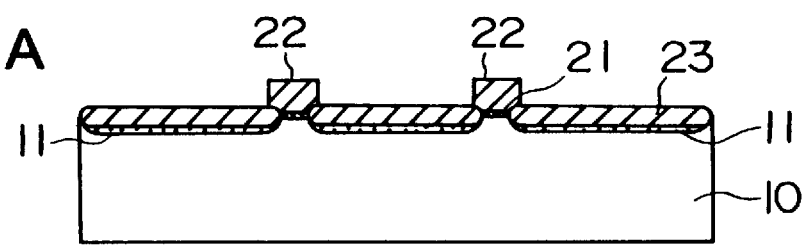
FIGS. 4A and 4B are views of is a manufacturing process subsequent to the process of FIGS. 3A and 3B, FIG. 4A being a sectional view and FIG. 4B being a plan view.
Figure 4B:
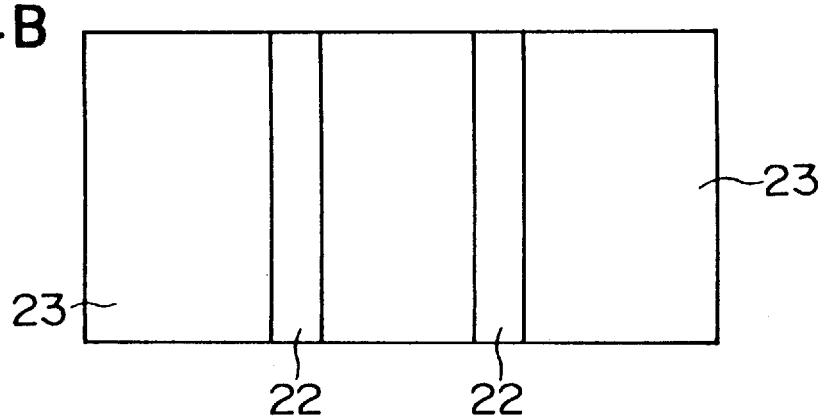

Next, as shown in FIG. 4, an oxide layer (insulating isolation layer) 23 is formed by thermal oxidation using the silicon nitride layer 22 as a mask. The thickness of the oxide layer 23 may be selected so that electrons do not tunnel. Specifically, the thickness of the oxide layer 23 is made thinner than that of the LOCOS, for example 30 to 100 nm. An impurity diffusion line 11 lies beneath the oxide layer 23, composing the buried diffusion region.

Figure 5A:
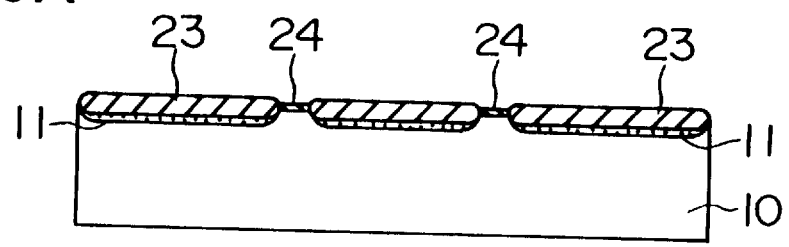
FIGS. 5A and 5B are views of a manufacturing process subsequet to the process of FIGS. 4A and 4B, FIG. 5A being a sectional view and FIG. 5B being a plan view.
Figure 5B:
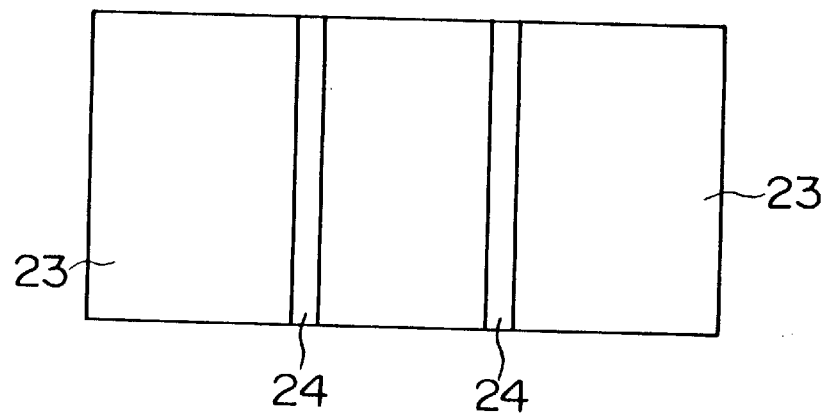

Next, as shown in FIG. 5, after the silicon nitride layer 22 and the pad oxide layer 21 are removed, a tunnel oxide layer 24 is formed to a thickness of for example 10 nm by thermal oxidation.

Figure 6A:
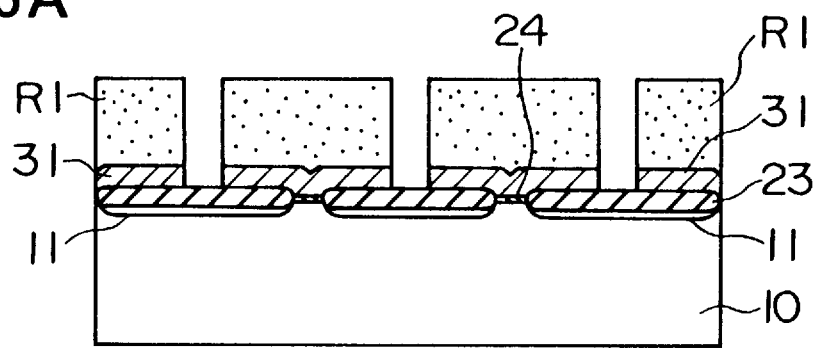
FIGS. 6A and 6B are views of a manufacturing process subsequent to the process FIGS. 5A and 5B, FIG. 6A being a sectional view and FIG. 6B being a plan view.
Figure 6B:
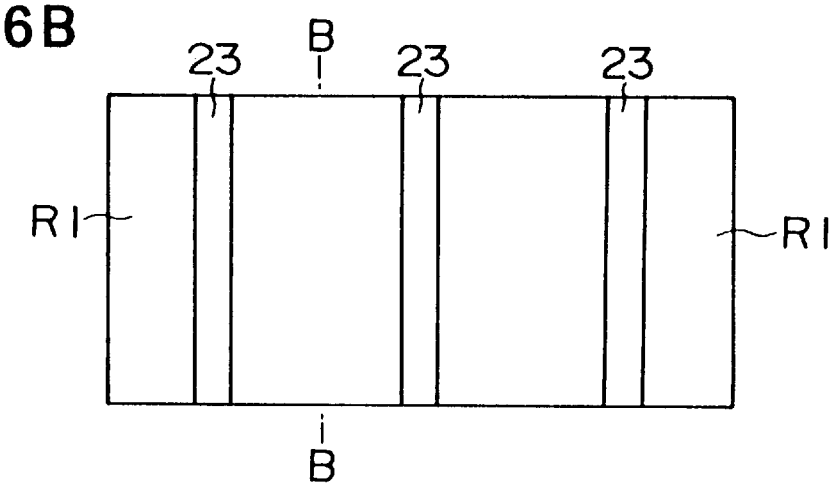

Next, as shown in FIG. 6, a first conductive layer 31 which will form a floating gate is deposited by a polysilicone CVD process. Then, the resist R1 is applied by spin coating and so on and is patterned using photolithography, subsequently, the first conductive layer 31 is patterned by etching using the resist R1 as a anti-etching mask. In this stage, as shown in FIG. 6B, a first conductive layer 31 corresponding to a center part of the oxide layer 23 along the impurity diffusion line 11 (B—B line in FIG. 6B) is removed in strips.

Figure 7A:
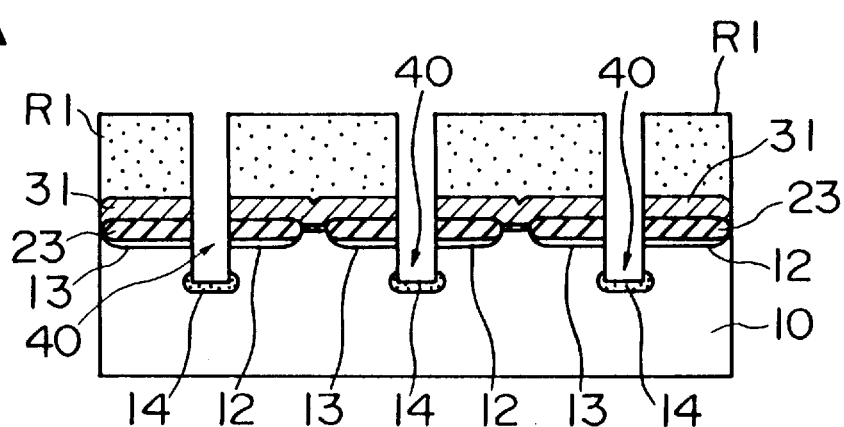
FIGS. 7A and 7B are views of a manufacturing process subsequent to the process of FIGS. 6A and 6B, FIG. 7A being a sectional view and FIG. 7B being a plan view.
Figure 7B:
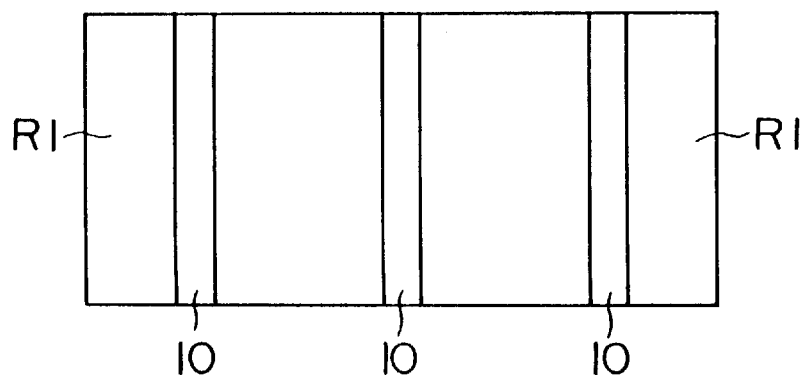

Next, in the present invention, as shown in FIG. 7, element splitting trench 40 is formed in the substrate using the resist R1 as a mask by etching the oxide layer 23 and the substrate 10 successively. Consequently, the impurity diffusion line 11 is split up by the element splitting trench 40 to form a source line 12 and a bit line 13.

After the element splitting trench 40 is formed, if necessary, a channel stop region 14 is formed by ion implantation. In this case, in present embodiment, each source and drain is connected each other, so the ion implantation to a side wall of the element isolation trench may not be required in a view point of preventing inversion, it is preferable to form a channel stop in only bottom of the element splitting trench 40.

Figure 8A:
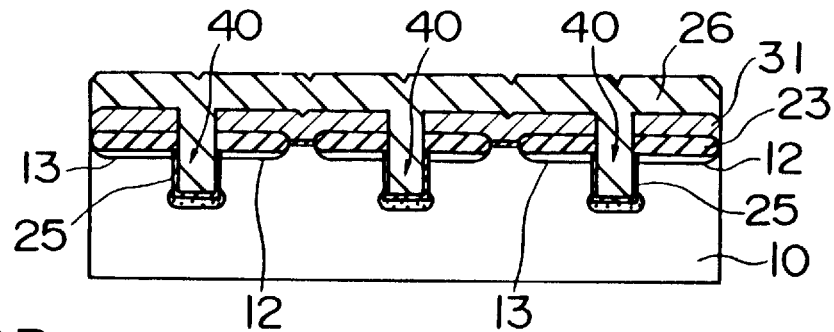
FIGS. 8A and 8B are views of a manufacturing process subsequent to the process of FIGS. 7A to 7B, FIG. 8A being a sectional view and FIG. 8B being a plan view.
Figure 8B:
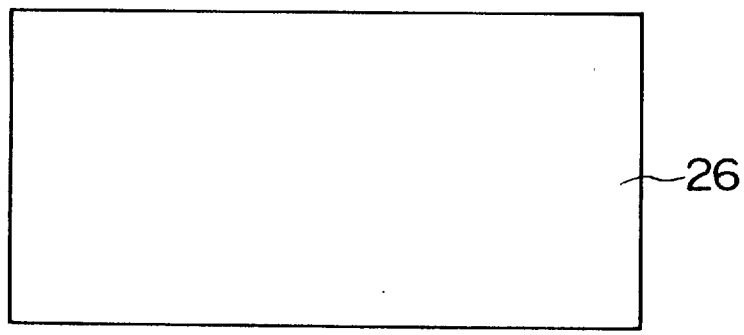

Next, as shown in FIG. 8, after a thermal oxidation layer 25 is formed on an inner wall of the element splitting trench 40, the element splitting trench 40 is buried with the insulating material 26 such as a silicon oxide by CVD.

Figure 9A:
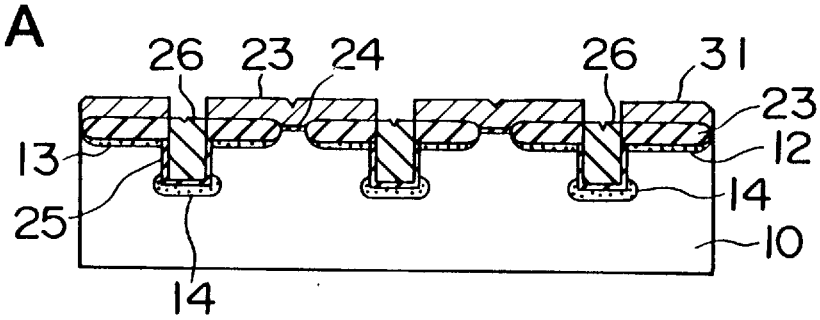
FIGS. 9A and 9B are views of a manufacturing process subsequent to the process of FIGS. 8A and 8B, FIG. 9A being a sectional view and FIG. 9B being a plan view.
Figure 9B:
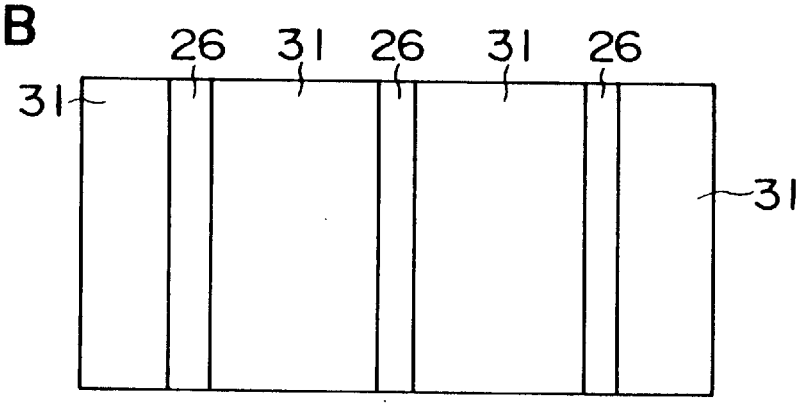

Next, as shown in FIG. 9, by etching-back of the insulating layer 26, a floating gate 23 is exposed and the insulating layer 26 remains in the element splitting trench 40. In this stage, preferably the etching may be performed at over rate, so that the side wall of the floating gate 23 is exposed, whereby the surface area of floating gate 23 is increased, so that the coupling ratio is improved. To ensure insulation, a surface of the insulating layer 26 must be higher than the surface of the silicon substrate 10. In this embodiment, the insulating layer 23 is thick, so such height control is easy. Thickness of the insulating layer 23 should be selected in view point of this height control.

Next, returning to FIG. 1, the ONO layer 27 is formed to a thickness of about 20 nm, a polhysilicone layer 32 which will compose the control gate is deposited. After the resist layer is formed and patterned, then the polysilicone layer for the control gate 32, the ONO layer 27 and the polysilicone layer for the floating gate 31 are etched using the resist layer as a mask successively. The ion implantation is performed using same resist layer as a mask, whereby the memory cells next to each other along the bit line are isolated. Thus the memory cell configuration as shown in FIG. 1 is achieved.

In FIG. 1B, one memory cell area is represented by the dotted line. In case a minimum dimension is defined as F and memory cells are arrayed with minimum pitch, one memory cell area is small in size of only $6F^2$.

According to the present manufacturing process, the element splitting trench 40 can be formed in a self-aligned process using the same mask as the one with which the floating gate is etched, so the element isolation can be performed without increasing the memory cell area. This element isolation process can be applied to only the memory cell area. Therefore, the LOCOS isolation is applied to the area that requires a wide isolation such as the peripheral circuit, whereas the trench isolation is applied to the area where requires the narrow isolation such as the memory cell. This is accomplished without difficult processing which buries the wide isolation trench such as bias ECR, CVD, CMP (chemical mechanical polishing) and selective epitaxial, the element isolation can therefore be performed easily.

Figure 10:
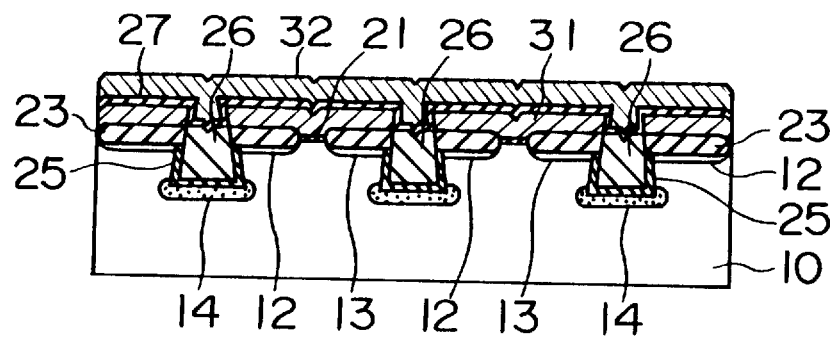
FIG. 10 is a sectional view of another example of semiconductor device of the present invention.

In above embodiment, a sectional configuration of the element splitting trench 40 has the shape of rectangle or the like formed by vertical etching. But as shown in FIG. 1, a sectional configuration of the element splitting trench 40 may have the shape of a reverse taper which has wider and wider width from top to bottom. In FIG. 10, reference numbers described above show the same parts. In the conventional trench, to avoid a localized electric field, the sectional configuration of the conventional splitting isolation trench has a shape of taper which has wider and wider width from bottom to top. But in the present invention from a view point of avoiding ion implantation for a channel stop to the side wall of the element splitting trench, it is preferable that the sectional configuration of the element isolation trench 40 may have a shape of rectangle or reverse taper which has wider and wider width from top to bottom. Such a configuration of the element isolation trench can be formed by for example controlling a gas flowing rate of etching gas, for example $Cl_2$ and $N_2$.

Figure 11:
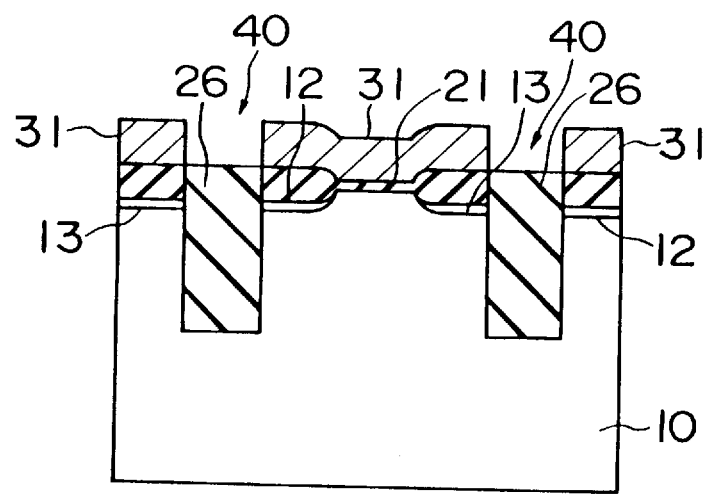
FIG. 11 is a sectional view of configuration of the present invention.

In the explanation as described above, the present invention is applied to a separate source type memory cell, but can also be applied, for example, to another semiconductor device shown in FIG. 11. In the semiconductor device shown in FIG. 11, a gate insulating layer 21 is formed on a surface of a semiconductor substrate 10 and an insulating isolation layer 23 is formed on both sides of a gate insulating layer 21. An impurity diffusion regions 12 and 13 are formed in the substrate 10 beneath the insulating isolation layer 23, and a first conductive layer 31 is formed on both the gate insulating layer 21 and the insulating isolation layer 23. An element splitting trench 40 is formed, cutting through the first conductive layer 31 and the insulating isolation layer 23, digging the substrate 10, crossing at right angles to the surface of the substrate 10, and buried with insulating material 26.

Figure 12:
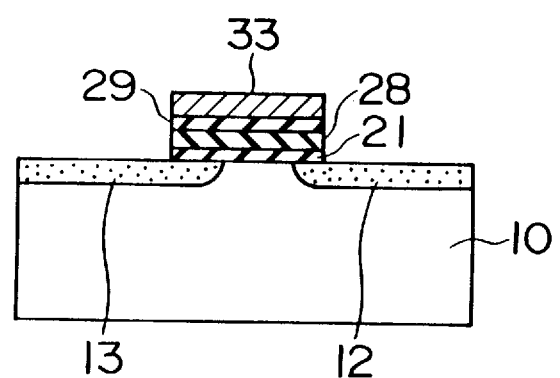
FIG. 12 is a sectional view of configuration of MNOS type non-volatile memory.

Next, another embodiment of a metal nitride oxide semiconductor (MNOS) type EEPROM according to the present invention will be explained. A schematic configuration of MNOS type semiconductor device is shown in FIG. 12. In FIG. 12, a silicon nitride layer (trap insulating layer) 28 and then a silicon oxide layer 29 are laminated on a gate insulating layer 21, further a gate electrode 33 such as polysilicone, aluminum and so on is laminated on the silicon oxide layer 29. A write-erase is performed by applying a high voltage to the gate insulating layer 21, the tunneling current through the gate insulating layer 21 occurs, and electrons are trapped by silicon nitride layer 28.

Thus the configuration can be achieved by the manufacturing process as explained above. For example, the same process from FIG. 1 to FIG. 9 may be performed. In this case, first conductive layer 31 is used as a protection of the oxide layer 23, and removed away later, so another material other than the polysilicone can be used. If the ONO layer is formed instead of the first conductive layer 31, when the etching back to bury the element splitting trench with insulating material 26, the ONO layer is also removed. If the element splitting trench 40 is formed by etching using only a resist layer as a mask without forming the first conductive layer 31, when etching back to bury the element splitting trench with the insulating material 26, the oxide layer 23 is etched away. Therefore, any protective layer such as the first conductive layer 31 is required. A thickness of the gate oxide (tunnel oxide) can be thicker than 10 nm.

Figure 13:
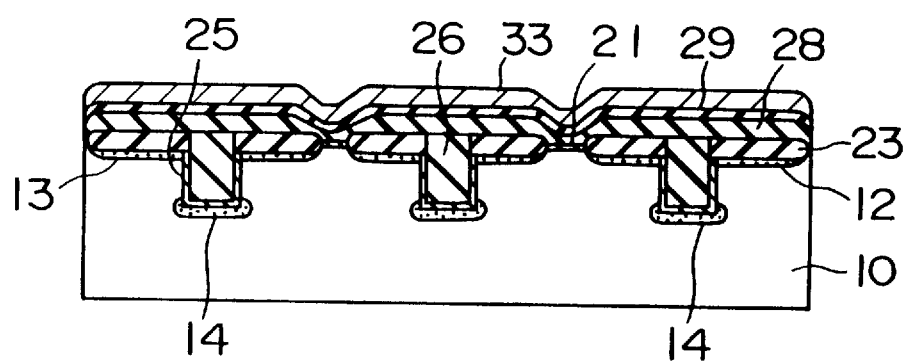

The process step shown in FIG. 9 is a process that after the first conductive layer 31 is patterned and the element splitting trench 40 is formed, the element splitting trench is buried with the insulating material 26. Then the polysilicone layer 31 is removed. Next, as shown in FIG. 13, after the silicon nitride layer is formed to a thickness of about 10 nm, the silicon oxide layer 29 is formed to a thickness of 4 nm by thermal oxidation of the silicon nitride layer 28. In certain cases, a process of forming the silicon oxide layer 29 is eliminated. Then the gate electrode 33 composed of polysilicone or aluminum is formed. Next, the gate electrode 33, the silicon oxide layer 29 and the silicon nitride layer 28 are patterned by etching to form the MNOS transistor shown in FIG. 13.

The semiconductor device of the present invention has high withstand voltage for inversion and for punch-through in conjunction with the narrow isolation area.

According to the manufacturing method of the semiconductor device of the present invention, the above semiconductor device can be formed in easy and at a reliable process.

While this invention has been described with reference to the embodiments, this description is not intended to be construed in a limiting sense. Various modifications of the illustrative embodiments are covered within the true scope of the invention.

What is claimed is:

1. A semiconductor device comprising:

a substrate, a gate insulating layer formed on the substrate, insulating isolation layers formed on each side of the gate insulating layer, an impurity diffusion region formed in the substrate beneath the insulating isolation layer, and an element splitting trench which separates at least the insulating isolation layer and the impurity diffusion region into two parts respectively wherein separated first and second parts of the impurity diffusion regions form respective source or drain regions of distinct memory transistors.

2. A semiconductor device as set forth in claim 1, wherein said element splitting trench splits up a first conductive layer formed on both the gate insulating layer and the insulating isolation layer into two parts.

3. A semiconductor device as set forth in claim 2, wherein the semiconductor device is a non-volatile semiconductor memory device having an insulating layer formed on said first conductive layer which forms a floating gate, and a second conductive layer which composes a control gate is formed on the insulating layer.

4. A semiconductor device as set forth in claim 1, wherein the first and second parts of the impurity diffusion region are source and drain lines respectively of a plurality of adjacent memory cells.

5. A semiconductor device as set forth in claim 4, wherein the non-volatile semiconductor memory cells which share common source and drain lines are arrayed along the source and drain lines.

6. A semiconductor device as set forth in claim 1, wherein a further insulating layer including a silicon nitride layer is formed on both the insulating isolation layers and the element splitting trench, and a first conductive layer forming a gate electrode is formed on the insulating layer.

7. A semiconductor device as set forth in claim 1, wherein the element splitting trench has a wider bottom than top.

8. A semiconductor device as set forth in claim 1, wherein a diffusion region channel stop is formed in a bottom area of the element splitting trench.

9. A semiconductor device as set forth in claim 1, wherein the element splitting trench separates a plurality of memory cells in a memory array.

* * * * *